(12) United States Patent
Tran et al.

(10) Patent No.: US 6,434,048 B1
(45) Date of Patent: Aug. 13, 2002

(54) PULSE TRAIN WRITING OF WORM STORAGE DEVICE

(75) Inventors: Lung T. Tran, Saratoga; Manish Sharma, Sunnyvale, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/908,901

(22) Filed: Jul. 20, 2001

(51) Int. Cl.$^7$ ................................................ G11C 7/00
(52) U.S. Cl. ........................ 365/185.19; 365/185.18; 365/185.22; 365/189.07
(58) Field of Search .................. 365/185.18, 185.19, 365/189.01, 189.07, 236, 185.22

(56) References Cited

U.S. PATENT DOCUMENTS

| | | | |
|---|---|---|---|
| 4,631,701 A | 12/1986 | Kappeler et al. | ............ 364/900 |
| 4,740,924 A | * 4/1988 | Tielert | ......................... 365/194 |
| 5,075,571 A | 12/1991 | Dhong et al. | ............ 307/296.2 |
| 5,305,253 A | * 4/1994 | Ward | ............................ 365/73 |
| 5,343,434 A | 8/1994 | Noguchi | ..................... 365/218 |
| 5,469,559 A | 11/1995 | Parks et al. | ................... 395/433 |
| 5,471,040 A | 11/1995 | May | ............................ 235/451 |
| 5,623,442 A | 4/1997 | Gotou et al. | ........... 365/185.08 |
| 5,684,741 A | 11/1997 | Talreja | ................... 365/185.22 |
| 6,141,280 A | * 10/2000 | Cho | ........................ 365/189.07 |
| 6,212,101 B1 | 4/2001 | Lee | ......................... 365/185.17 |

OTHER PUBLICATIONS

Tae–Sung Jung et al., "A 117–mm2 3.3–V Only 128–Mb Multilevel NAND Flash Memory for Mass Storage Applications", IEEE Journal of Solid–State Circuits, vol. 31, No. 11, Nov. 1996, pp. 1575–1583.

"Intel StrataFlash Memory Technology", Intel AP–677 Application Note, Order No. 297859–002, Dec. 1998, pp. 1–13.

Dave Bursky, "High–Density Flash Memories Tackle Mass–Storage Needs", Electronic Design Report, Sep. 3, 1996, 5 pages.

* cited by examiner

*Primary Examiner*—Son T. Dinh

(57) ABSTRACT

A method and circuit write a memory cell. The method applies a pulse train to a write line connected to the memory cell. The number of pulses in the pulse train is not predetermined. The method compares a value on the input side of the cell to a reference value, wherein the input side of the memory cell provides an indication that a writing operation is complete. The method discontinues the pulse train on the write line, in response to the comparing step, preferably if the value on the write line exceeds the reference value. Preferably, the pulses are short in width and large in magnitude. The method may optionally count the number of pulses in the pulse train, and discontinue the pulse train on the write line and/or declare the cell as unusable if the number of pulses exceeds a predetermined maximum. The circuit comprises a pulse train generator and a comparator. The pulse train generator has an output and an enable input. The output is connected to a write line connected to the memory cell. The output, when enabled, carries a pulse train. The comparator has two inputs and an output. One of the inputs is connected to the write line. The other of the inputs is connected to a reference. The output is connected to the enable input of the pulse train generator, whereby the pulse train generator is disabled or enabled depending upon the comparator output. Optionally, the circuit further comprises a counter that counts pulses and disables the pulse train generator after a predetermined maximum number of pulses. A complete memory system comprises an array of memory cells, a write line, and a pulse train generator and comparator as described above.

37 Claims, 4 Drawing Sheets

PULSE TRAIN WRITING OF WORM STORAGE DEVICE

RELATED APPLICATIONS

The following United States patent application contains related subject matter: Ser. No. 09/917,882, entitled "WRITE PULSE LIMITING FOR WORM STORAGE DEVICE."

FIELD OF THE INVENTION

This invention relates generally to electronic memory, and more particularly to methods and circuits for writing write-once read-many (WORM) memory devices.

BACKGROUND OF THE INVENTION

In the field of memories, there is a demand for ever increasing densities and lower cost. This is especially true for non-volatile memories, i.e., those that do not lose data when power is not supplied. A non-volatile memory may be write-once-read-many ("WORM") or reprogrammable. As the name suggests, a WORM memory is written (programmed) once, and it is thereafter permanent for all practical purposes. Most WORM memories are field programmable, rather than requiring that programming be performed during manufacture. Examples of field programmable WORM memories include bipolar PROM (programmable read only memory), CMOS (complementary metal oxide semiconductor) PROM, EPROM (erasable PROM), and tunnel-junction based ROM.

WORM memories are programmed by applying a relatively large voltage to selected cells in order to alter the physical characteristics of the selected cells. The alteration mechanism depends upon the type of memory. For instance, a unit memory cell of a bipolar or CMOS PROM typically consists of one transistor in series with a fuse and/or an anti-fuse, and a PROM is programmed by applying a large voltage across the fuse or anti-fuse of the selected cells. The applied voltage causes the fuse to open or the anti-fuse to short (or both if both are present). As a result, the resistance across the cell is altered, and a reading operation can detect the alteration, as contrasted with the unaltered state, by applying a small read voltage to the cell and sensing the current flowing through the cell. As another example, a unit memory cell of a EPROM typically consists of a transistor and a floating gate, and an EPROM is programmed by applying a large potential to transfer charge from the silicon substrate to the floating gate of selected cells. The mechanism for the charge transfer in this case is Fowler-Nordheim electron tunneling.

Another example of a memory cell is an anti-fuse tunnel junction 100, which is illustrated in FIG. 1. The anti-fuse tunnel junction 100 includes abottom electrode 120, and insulator barrier layer 140 and a top electrode 160. The bottom electrode 120 and the top electrode 160 could be conductor metals such as Cu, Al or the like or magnetic materials such as NiFe, CoFe, NiFeCo or the like. The insulator barrier layer 140 is typically very thin, from 5 Å (Angstroms) to 100 Å. Generally, the insulator barrier layer 140 is made of $TaO_x$, $AlO_x$, $SiO_x$, $SiN_x$, $AlN_x$ or the like. As a bias voltage is applied across the junction, the thin insulator barrier allows quantum mechanical tunneling to occur and a current flows from one electrode, across the barrier layer 140, to the other electrode. The resistance of the tunnel junction is exponentially dependent on the thickness of the barrier layer. Therefore, by controlling the thickness during manufacturing, the tunnel junction can be made to a desired resistance value that is suitable for a particular application.

A circuit for programming a generic WORM memory is part of a WORM memory system 200 illustrated in FIG. 2A. The WORM memory system 200 comprises an array of memory cells 210. The memory cells 210 are preferably set in a rectangular arrangement of rows and columns. Each memory cell 210 is at the intersection of row conductor 220 and a column conductor 230. A row decoder 240 connects to the row conductors 220, and a column decoder 250 connects to the column conductors 230. Address lines (not shown) control the row decoder 240 and/or the column decoder 250 to select a desired row, column or individual cell 210. As illustrated in FIG. 2A, one particular cell 210 has been selected for writing. As part of the writing process, a write voltage $V_{WR}$ is applied across the cell 210.

A graph 260 of the write voltage $V_{WR}$ is illustrated in FIG. 2B. The write voltage $V_{WR}$ is a pulse 270 of height $V_1$ and fixed width $T_1$. For every cell 210 to be written, that cell 210 is selected through the row decoder 240 and the column decoder 250; then, the same pulse 270 is applied to the selected cell(s).

A disadvantage of WORM memories is that $V_1$ is typically required to be a high value to program the memories. In the case of an EPROM, a high voltage is needed for Fowler-Nordheim electron tunneling to occur. In the case of PROM with a polysilicon fuse as the programmable element, a large voltage is needed to deliver enough energy to blow the polysilicon fuse. In the case of a bipolar PROM with one forward and one reversed diode as a memory cell, a large voltage is needed to exceed the reverse voltage of the diode to cause it to breakdown. In the case of a WORM with a tunnel junction anti-fuse as a programmable element, the breakdown voltage of the tunnel junction is as low as 1.5 V (volts). This breakdown voltage can be controlled by the thickness of the barrier layer of the tunnel junction. A thicker barrier has a higher breakdown voltage, and a thinner barrier has a lower breakdown voltage, but these types of anti-fuse junctions exhibit significant variations in breakdown voltage.

The programming of some WORM memories exhibit significant variability from cell to cell in the required writing voltage level. This variation can result from physical variation from cell to cell in the manufacturing process. Some cells may require less energy to be programmed, while other cells may require more. In other words, the pulse 270 may be longer than necessary for some cells yet too short for other cells. To increase yield rates, the pulse duration T, is typically much longer than necessary for the vast majority of cells.

It is known in the art to verify the efficacy of a writing operation and to repeat the standard writing operation when it has been unsuccessfully attempted. Typically, the efficacy of a writing operation is tested by sensing the output voltage from a sense amplifier (not shown) connected to the output of the memory cell 210. An example of such an approach is disclosed in U.S. Pat. No. 5,684,741.

SUMMARY OF THE INVENTION

In one respect, the invention is a method for writing a memory cell. The method applies a pulse train to a write line connected to the memory cell. The number of pulses in the pulse train is not predetermined. The method compares a value on an input side of the cell to a reference value, wherein the input side of the memory cell provides an indication that a writing operation is complete. The method discontinues the pulse train on the write line, in response to the comparing step, preferably if the value on the write line exceeds the reference value. Preferably, the pulses are short in width and large in magnitude. The method may optionally count the number of pulses in the pulse train, and discontinue the pulse train on the write line and/or declare the cell as unusable if the number of pulses exceeds a predetermined maximum.

In another respect, the invention is a circuit for writing a memory cell. The circuit comprises a pulse train generator and a comparator. The pulse train generator has an output and an enable input. The output is connected to a write line connected to the memory cell. The output, when enabled, carries a pulse train. The comparator has two inputs and an output. One of the inputs is connected to the write line. The other of the inputs is connected to a reference. The comparator output is connected to the enable input of the pulse train generator, whereby the pulse train generator is disabled or enabled depending upon the comparator output. Optionally, the circuit further comprises a counter that counts pulses and disables the pulse train generator after a predetermined maximum number of pulses.

In yet another respect, the invention is a memory system. The memory system comprises an array of memory cells, a write line, and a pulse train generator and comparator as described above.

As used herein, the terms "has," "have" and "having" are open-ended. Thus, for example, the pulse train generator may comprise other signal interfaces besides the output and the enable input referred to above. Furthermore, the terms "connected" and its variants, as used herein, mean connected directly or indirectly through an intermediary element.

In comparison to known prior art, certain embodiments of the invention are capable of achieving certain advantages, including some or all of the following: (1) the writing process is faster and more reliable; (2) elements in series with the memory cell are less likely to be damaged; (3) the writing process utilizes less power; (4) the number of pulses necessary can be calibrated in advance; (5) the number of pulses required for writing is a measure of the quality of the memory cell; and (6) no cross connections from the array outputs are needed, as all relevant circuitry is on only the writing side of the array. Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 2A:
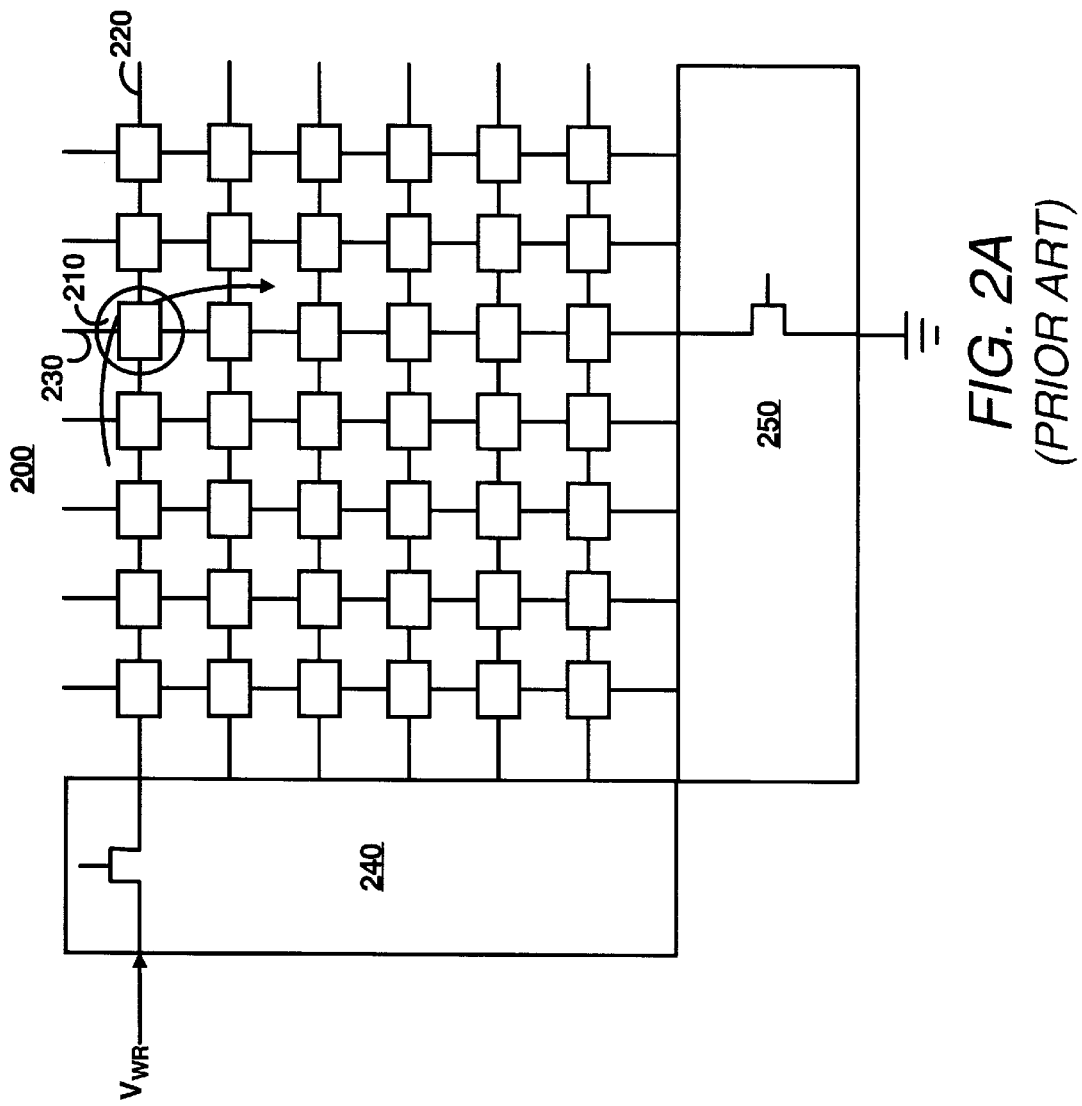
FIG. 2A illustrates a prior art circuit for programming a generic WORM memory.
Figure 3B:
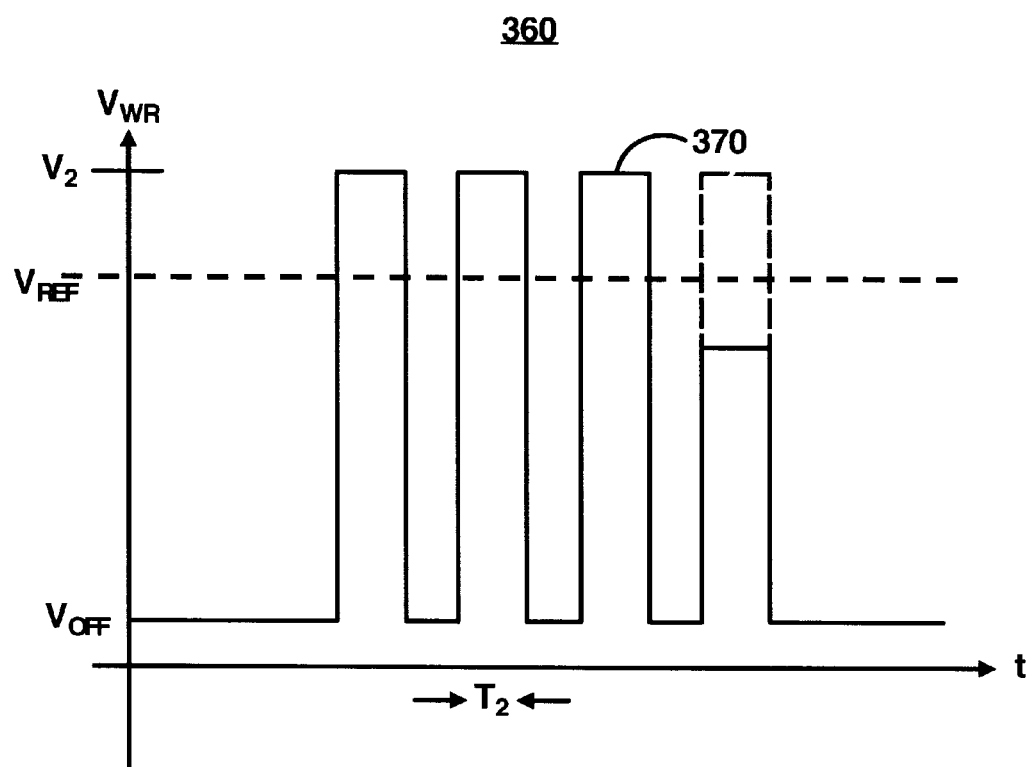
FIG. 3B is a graph of a write voltage pulse train for use in the circuit of FIG. 3A.
Figure 3A:
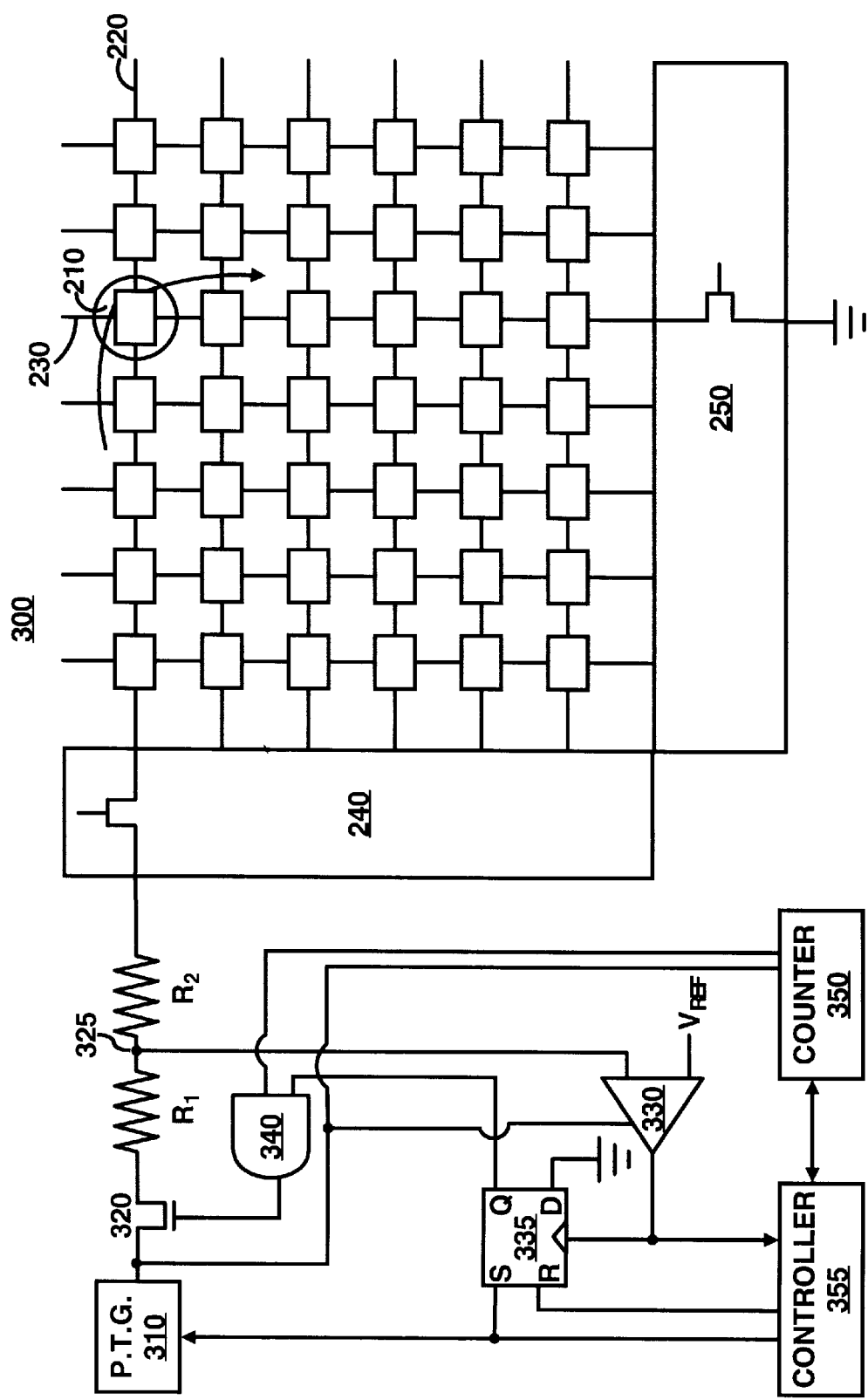
FIG. 3A illustrates a circuit for programming a WORM memory, according to an embodiment of the invention.

FIG. 3A illustrates a WORM memory system 300, including a circuit for programming the memory, according to an embodiment of the invention. The WORM memory system 300 comprises the same basic WORM memory as illustrated in FIG. 2A. However, the WORM memory system 300 comprises a different circuit for programming the memory. The programming circuit applies a variable number of brief, high magnitude pulses to a memory cell to be written. The programming circuit includes feedback circuitry that monitors when the writing operation is effective and, responsive to that monitoring, reduces the unnecessary expenditure of energy and time.

The memory cell 210 in the memory system 300 may be of any type, now existing or developed in the future, such as any of the ones discussed above or a fuse and anti-fuse in series.

The programming circuit includes a pulse train generator 310, which connects (indirectly) to a write line for the selected memory cell 210. The write line in this case is the row conductor 220 or a line connectable (directly or indirectly) to the row conductor 220 via the row decoder 240. The labels "row" and "column" are arbitrary except as relative to each other. Therefore, in general, the write line could be the column conductor 230 or a line connectable to the column conductor 230 via the column decoder 250.

In one embodiment, the pulse train generator 310 comprises an oscillator with peripheral circuitry to generate a square wave at the desired frequency, amplitude and offset, as described in greater detail with reference to FIG. 3B below.

The output of the pulse train generator 310 connects to the drain terminal of a transistor 320. The source terminal of the transistor 320 connects to a resistor $R_1$ and a resistor $R_2$ in series. The resistor $R_2$ connects to the row decoder 240. The gate terminal of the transistor 320 is an enable input. When the voltage at the gate terminal is high, the transistor 320 conducts from drain to source, allowing the pulse train generator output to reach the memory cell 210 (assuming the row decoder 240 and the column decoder 250 are configured to select the memory cell 210). When the voltage at the gate terminal is low, the transistor 320 "turns off" (i.e., is open between the source and drain).

Between the resistors $R_1$ and $R_2$ is a node 325, which connects to an input of a voltage comparator 330. The other input of the voltage comparator 330 is connected to a reference voltage $V_{REF}$. The output of the voltage comparator 330 switches from high to low when the voltage on the node 325 becomes less than $V_{REF}$; otherwise, the output of the voltage comparator 330 is high. The output of the voltage comparator 330 connects at the gate of the transistor 320, via an SR flip-flop 335 and an AND gate 340. The output of the pulse train generator 310 is also connected to an enable terminal of the voltage comparator 330. In this way, when the voltage at the node 325 exceeds or drops below (depending upon how the memory cell is altered when written) $V_{REF}$, the pulse train is discontinued on the write line for the memory cell 210.

If writing a cell causes its resistance to decrease, then the voltage at the node 325 will fall when the writing operation completes; if writing a cells causes its resistance to increase, then the voltage at the node 325 will rise when the writing operation completes. In either case, one skilled in the art can easily set $V_{REF}$ and the polarity of the comparator 330 to distinguish between the pre-writing and post-writing conditions. The slew rate of the voltage comparator 330 is preferably fast enough to react within one pulse of the pulse train output from the pulse train generator 310.

The resistors $R_1$ and $R_2$ act as a voltage divider. Preferably, both $R_1$ and $R_2$ are small resistors, so that the write signal is not too severely attenuated. One skilled in the art can choose $R_1$ and $R_2$ for proper operation in conjunction with the comparator 330, the memory cell 210 and the other circuitry of the memory system 300.

The other input to the AND gate 340 is connected to a counter 350. The counter 350 is preferably a down counter that is pre-loaded with a value that represents a maximum pulse count. Each time the pulse train generator 310 generates a pulse, the counter 350 decrements. When the count reaches zero, the counter asserts its output. As a result, the pulse train on the write line is discontinued after a maximum number of pulses. Those skilled in the art would recognize that other counter configurations (e.g., an up counter) could accomplish the same function.

In an alternative embodiment, the transistor 320 can be replaced by an AND gate having two inputs and an output. One of the inputs is connected to the pulse train generator 310; the other of the inputs is connected to the output of the AND gate 340 (or its complement, as appropriate). In this embodiment, the amplitude and offset of the pulse train is constrained to be standard logic signal levels.

The final component of the programming circuit illustrated in FIG. 3A is a controller 355, which advances and resets the counter 350 as necessary. The controller 355 initiates the write sequence by enabling the pulse train generator 310, presetting the counter 350 and setting the SR flip-flop 335. The controller 355 detects each pulse output from the pulse train generator 310 and responds by sending a "down" (or "up") signal to the counter 350 each time. The controller 355 also detects when writing is complete by monitoring the output of the voltage comparator 330, and resets the counter 350 and the SR flip-flop 335 as well as disables the pulse train generator 310 in response. Finally, the controller 355 controls the pulse train generator 310, when necessary to disable the pulse train, and sets the SR flip-flop, as appropriate.

Those skilled in the art would appreciate that the feedback circuitry illustrated in FIG. 3A is merely one example of circuitry that can function as intended. Many other feedback arrangements can accomplish the same objective: monitoring when the write line or input side of the memory cell reveals that writing has been effectively accomplished and, in response, terminating the writing signal.

Figure 2B:
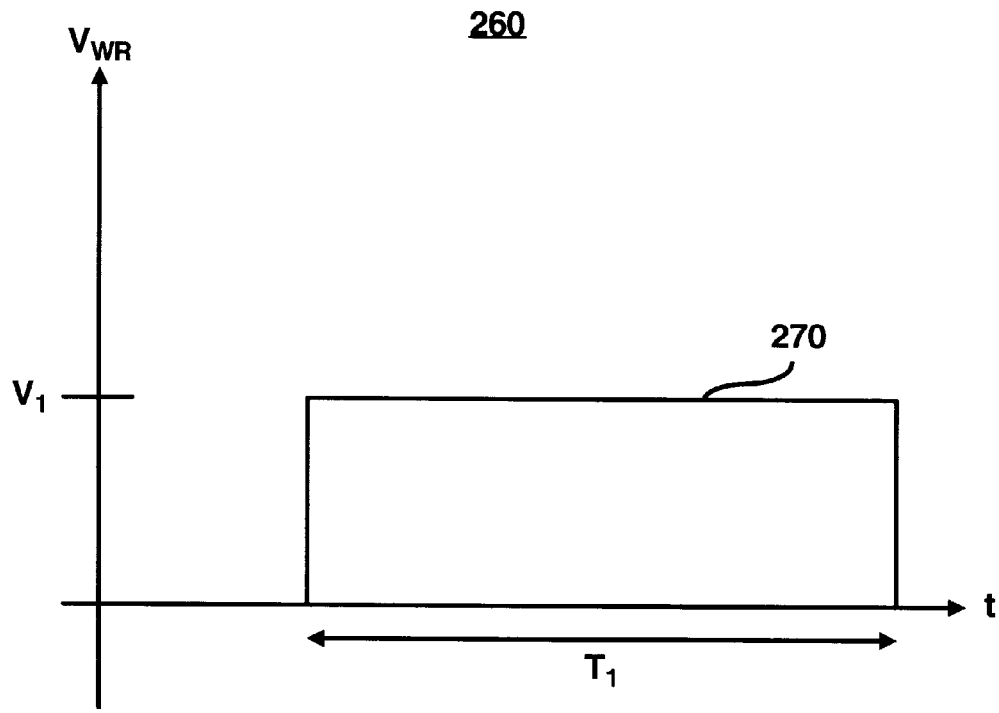
FIG. 2B is a graph of a write voltage pulse for use in the circuit of FIG. 2A.

FIG. 3B is a graph of a write voltage pulse train 370 at the node 325 of FIG. 3A. The write voltage pulse train 370 is initially a series of pulses of height $V_2$. Each pulse in the train 370 has a width $T_2$, which is preferably much narrower than $T_1$, the width of the conventional write pulse 270 (FIG. 2). The number or pulses in the pulse train is variable, preferably up to a maximum. Only the approximate number of pulses necessary to write a cell is applied to the cell. In this way, the pulse train 370 is most often shorter (usually considerably shorter) than the conventional write pulse 270. Thus, different numbers of pulses may be applied to different memory cells, depending upon the variability of the cells. In this way, the programming circuit of FIG. 3B self-adjusts to each cell.

The pulse train 370 is preferably offset by an amount $V_{OFF}$. In some embodiments, $V_{REF}$ is chosen to be a voltage value between zero and $V_{OFF}$ to enable monitoring for the conclusion of writing. According to this embodiment, when writing is complete, the pulses at the node 325 fall below $V_{REF}$. The voltage comparator 330 is enabled only during the pulses, by virtue of the connection of the enable input to the output of the pulse train generator 310.

The values of $V_2$, $T_2$ and $V_{OFF}$ are dependent upon the physics of the memory cell 210. The pulses should have sufficient energy such that a reasonable number of them can effectuate writing, but not so much energy that other circuitry (e.g., the row decoder 240 or the column decoder 250) is damaged. Given a particular memory cell 210, one skilled in the art can pick suitable values for $V_2$, $T_2$ and $V_{OFF}$.

Although the pulse train 370 is illustrated in FIG. 3B as having perfectly square edges, that is an ideal form. The pulse train 370 typically has exponential rises and falls between levels. In fact, in full generality, the shape of the pulses in the pulse train 370 is arbitrary. The pulses merely represent extra energy.

Figure 1:
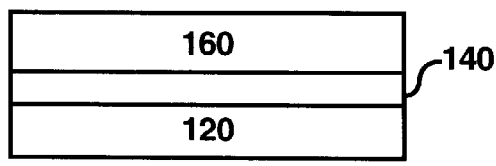
FIG. 1 depicts a tunnel junction anti-fuse memory cell.
Figure 4:
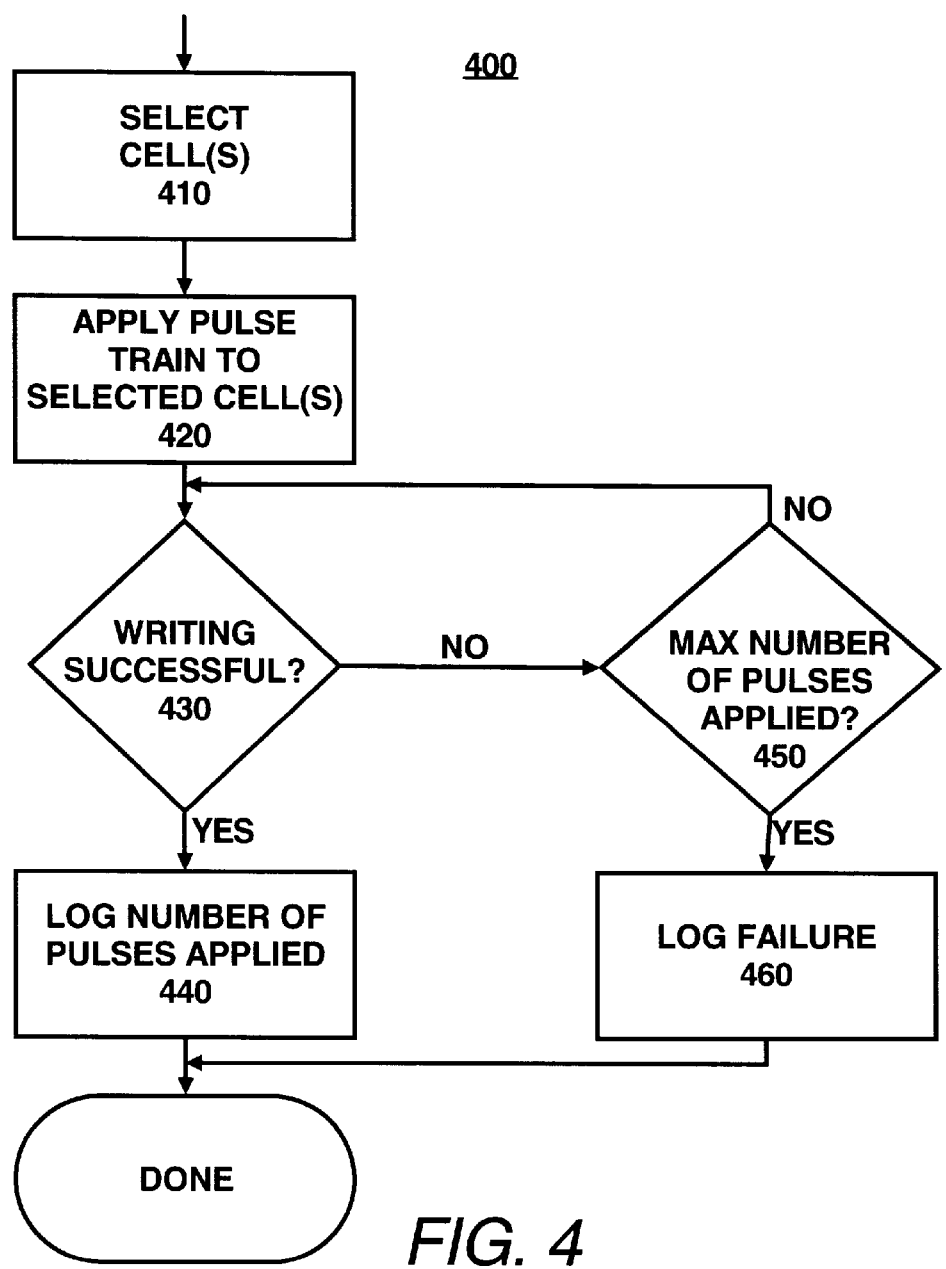
FIG. 4 is a flow chart of a method, according to an embodiment of the invention.

FIG. 4 is a flow chart of a method 400, according to an embodiment of the invention. The method 400 selects (410) one or more cells (e.g., an entire row) to be written. The method 400 initiates (420) a pulse train to the selected cell(s). The initiating step 420 turns on the pulse train 370 or a similar pulse train. Next, the method 400 monitors (430) whether the writing has been successful or not. The monitoring step 430 is preferably performed by monitoring the input side of the cell, rather than sensing the cell output. If and when the writing is successful, then method 400 optionally logs (440) the number of pulses applied to the cell. This number is a measure of the quality of the cell and of the memory system generally. The logged data may be used at a later time for device screening or statistical analysis. If the writing is not successful according to the monitoring step 430, the method 400 checks (450) whether the number of pulses applied so far exceeds a predetermined maximum. If not, then the method 400 loops back to the monitoring step 430 and repeats. The loop is preferably iterated once per pulse in the pulse train 370. If and when the maximum number of pulses is reached, then the method 400 exits the checking step 450 and optionally logs (460) a failure to write the cell.

The steps 420, 430 and 450 will next be described in more detail, as practiced in the specific hardware embodiment of FIG. 3A. In this case, the initiating step 420 involves three specific sub-steps. First, the controller 355 sets the counter 350 to a maximum count; this causes the counter output to be high. Second, the controller 355 sets the Q output of the SR flip-flop 335 high via the S input. Third, the controller 355 enables the pulse train generator 310 to output pulses. At this point, the voltage comparator 230 is enabled within the duration of each pulse, and the output of the voltage comparator 230 is initially high because $V_{REF}$ is less that the voltage at the node 225 during the duration of each pulse. Thus, the monitoring step 430 continues to answer "NO," unless and until the voltage at the node 225 drops below $V_{REF}$, at which point the output of the voltage comparator 230 goes from high to low, which causes the Q output of the SR flip-flop 335 to become low, which turns off the transistor 220. The high output of the voltage comparator 230 also signals the controller 355 that writing is complete. If, at the checking step 450, the maximum number of pulses is reached, then the counter output goes low, which turns off the transistor 220. In response, the controller 355 resets the SR flip-flop 335 such that its Q output goes low and disables the pulse train generator 310.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for writing a memory cell, the method comprising:
   initiating a pulse train on a write line connected to the memory cell, wherein a plurality of pulses in the pulse train is not predetermined;
   comparing a reference value to a value on an input side of the memory cell, wherein the input side of the memory cell provides an indication that a writing operation is complete; and
   discontinuing the pulse train on the write line in response to the indication that the writing operation is complete.

2. The method of claim 1, wherein the pulse train comprises the plurality of pulses that are substantially short in width and substantially large in magnitude.

3. The method of claim 1 wherein the memory cell comprises a fuse and an anti-fuse in series.

4. The method of claim 1 wherein the memory cell is selected from the group consisting of a bipolar PROM, a CMOS PROM, an EPROM, and a tunnel-junction anti-fuse.

5. The method of claim 1 wherein the reference value and the value on the input side of the cell are voltages.

6. The method of claim 1 wherein the value on the input side of the cell is a value on the write line.

7. The method of claim 1 wherein the discontinuing step further comprises:
   discontinuing the pulse train on the write line, if the value on the write line exceeds the reference value.

8. The method of claim 1, further comprising:
   counting a number for the plurality of pulses in the pulse train on the write line.

9. The method of claim 8, further comprising:
   discontinuing the pulse train on the write line in response to the number exceeding a predetermined maximum.

10. The method of claim 8, further comprising:
    declaring the memory cell as unusable in response to the number exceeding a predetermined maximum.

11. The method of claim 8 further comprising:
    logging the number of pulses.

12. A circuit for writing a memory cell, the circuit comprising:
    a pulse train generator having an output and an enable input, the output connected to a write line connected to the memory cell, the output, when enabled, being a plurality of pulses in a pulse train; and
    a comparator having two inputs and a comparator output, one of the inputs connected to the write line, the other of the inputs connected to a reference, the comparator output connected to the enable input of the pulse train generator, wherein the pulse train generator is one of disabled and enabled based on the comparator output.

13. The circuit of claim 12 further comprising:
    a counter storing a count value, the counter having an output connected to the enable input of the pulse train generator, wherein the counter counts pulses and disables the pulse train generator after a predetermined maximum number of pulses.

14. The circuit of claim 13 further comprising:
    a logic gate having two inputs and an output, one of the inputs connected to the output of the comparator, the other of the outputs connected to the counter output, the logic gate output connected to the enable input of the pulse train generator.

15. The circuit of claim 12 further comprising:
    a controller connected to the counter.

16. The circuit of claim 12 further comprising:
    a voltage divider connected between the pulse train generator output and the write line, wherein an intermediate node in the voltage divider is connected to the comparator input.

17. The circuit of claim 12 further comprising:
    a transistor connected between the pulse train generator output and the write line, the comparator output being connected to a terminal of the transistor such that the transistor is conducting or non-conducting depending upon the comparator output.

18. The circuit of claim 12 wherein the pulse train generator comprises:
    an oscillator; and
    an OR gate having two inputs and an output, one of the inputs connected to the oscillator, the other of the inputs being the enable input, the OR gate output being the pulse train generator output.

19. A memory system comprising:
    an array of memory cells;
    a write line connectable to at least one of the memory cells in the array;
    a pulse train generator having an output and an enable input, the output connected to the write line, the output, when enabled, being a plurality of pulses in a pulse train; and
    a comparator having two inputs and an output, one of the inputs connected to the write line, the other of the inputs connected to a reference, the output connected to the enable input of the pulse train generator, whereby the pulse train generator is disabled or enabled depending upon the comparator output.

20. The memory system of claim 19 further comprising:
    a row decoder connected to the array; and
    a column decoder connected to the array.

21. A method for writing a memory cell, the method comprising:
    initiating a pulse train on a write line connected to the memory cell, wherein a number of pulses in the pulse train is not predetermined;
    comparing a reference value to a value on an input side of the memory cell, wherein the input side of the memory cell provides an indication that a writing operation is complete;
    discontinuing the pulse train on the write line in response to the indication that the writing operation is complete; and
    counting the number of pulses in the pulse train on the write line.

22. The method of claim 21, further comprising:
    discontinuing the pulse train on the write line if the number of pulses exceeds a predetermined maximum.

23. The method of claim 21, further comprising:
    declaring the cell as unusable if the number of pulses exceeds a predetermined maximum.

24. The method of claim 21, further comprising:
    logging the number of pulses.

25. A circuit for writing a memory cell, the circuit comprising:
    a pulse train generator having an output and an enable input, the output connected to a write line connected to the memory cell, the output, when enabled, being a pulse train;
    a comparator having two inputs and an output, one of the inputs connected to the write line, the other of the inputs connected to a reference, the output connected to the enable input of the pulse train generator, whereby the pulse train generator is disabled or enabled depending upon the comparator output; and a counter storing a count value, the counter having an output connected to the enable input of the pulse train generator, wherein the counter counts pulses and disables the pulse train generator after a predetermined maximum number of pulses.

26. The circuit of claim 25, further comprising:

a logic gate having two inputs and an output, one of the inputs connected to the output of the comparator, the other of the outputs connected to the counter output, the logic gate output connected to the enable input of the pulse train generator.

27. A circuit for writing a memory cell, the circuit comprising:

a pulse train generator having an output and an enable input, the output connected to a write line connected to the memory cell, the output, when enabled, being a pulse train;

a comparator having two inputs and an output, one of the inputs connected to the write line, the other of the inputs connected to a reference, the output connected to the enable input of the pulse train generator, whereby the pulse train generator is disabled or enabled depending upon the comparator output; and a voltage divider connected between the pulse train generator output and the write line, wherein an intermediate node in the voltage divider is connected to the comparator input.

28. A circuit for writing a memory cell, the circuit comprising:

a pulse train generator having an output and an enable input, the output connected to a write line connected to the memory cell, the output, when enabled, being a pulse train; wherein said pulse train generator comprises:

an oscillator; and an AND gate having two inputs and an output, one of the inputs connected to the output of an S-R flip flop, the other of the inputs being the enable input, the AND gate output enable the connection of the pulse train generator output to the write line; and a comparator having two inputs and an output, one of the inputs connected to the write line, the other of the inputs connected to a reference, the output connected to a clock input of the S-R flip flop.

29. A circuit for writing a memory cell, the circuit comprising:

a pulse train generator having an output and an enable input, the output connected to a write line connected to the memory cell, the output, when enabled, being a plurality of pulses in a pulse train;

a comparator having two inputs and a comparator output, one of the inputs connected to the write line, the other of the inputs connected to a reference, an S-R flip-flop, wherein the comparator output is connected to a clock input of the S-R flip-flop; and a controller having an input connected to the comparator output and an output connected to the enable input of the pulse train generator, wherein the pulse train generator output is disconnected from the write line upon a change from a low voltage to a high voltage state on the comparator.

30. The circuit of claim 29, further comprising:

a counter storing a count value, the counter having a counter output connected to the enable input of the pulse train generator, wherein the counter counts pulses and disables the pulse train generator after a predetermined maximum number of pulses.

31. The circuit of claim 30, further comprising:

a logic gate having two logic gate inputs and a logic gate output, a first logic gate input connected to the comparator, the second logic gate input connected to the counter output, the logic gate output connected to the gate input of a transistor that enable or disable the connection of pulse generator output to the write line.

32. The circuit of claim 29, further comprising:

a controller connected to the counter.

33. The circuit of claim 29, further comprising:

a voltage divider connected between the pulse train generator output and the write line, wherein an intermediate node in the voltage divider is connected to the comparator input.

34. The circuit of claim 29, further comprising:

a transistor connected between the pulse train generator output and the write line, the comparator output being connected to a terminal of the transistor such that the transistor is conducting or non-conducting depending upon the comparator output.

35. The circuit of claim 29, wherein the pulse train generator comprises:

an oscillator; and an AND gate having two inputs and an output, one of the inputs connected to the output of S-R flip flop, the other of the inputs being the enable input, the AND gate output being the enable control to the pulse train generator output.

36. A memory system comprising:

an array of memory cells;

a write line connectable to at least one of the memory cells in the array;

a pulse train generator having an output and an enable input, the output connected to the write line, the output, when enabled, being a plurality of pulses in a pulse train; and a comparator having two inputs and an output, one of the inputs connected to the write line, the other of the inputs connected to a reference, a S-R flip-flop, wherein the comparator output is connected to a clock input of the S-R flip-flop; and a controller having an input connected to the comparator output and an output connected to the enable input of the pulse train generator, wherein the pulse train generator output is disconnected from the write line upon a change from a low voltage to a high voltage state on the comparator.

37. The memory system of claim 36, further comprising:

a row decoder connected to the array; and a column decoder connected to the array.

* * * * *